United States Patent
Szu et al.

(10) Patent No.: US 6,618,253 B1
(45) Date of Patent: Sep. 9, 2003

(54) RETAINER DEVICE FOR HEAT SINK ASSEMBLY

(75) Inventors: Ming-Lun Szu, Tu-Chen (TW); Hao-Yun Ma, Tu-Chen (TW); Robert G. McHugh, Golden, CO (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/143,589

(22) Filed: May 9, 2002

(51) Int. Cl.$^7$ ................................................ H05K 7/20
(52) U.S. Cl. ...................................... 361/719; 257/719
(58) Field of Search .............................. 257/718, 719, 257/722, 726, 727; 165/80.3, 185; 248/505, 510; 24/453, 457, 458, 625; 174/16.3; 361/703–705, 709–712, 717–719

(56) References Cited

U.S. PATENT DOCUMENTS

| | | | | |
|---|---|---|---|---|
| 5,251,101 A | * | 10/1993 | Liu | 361/717 |
| 5,493,475 A | * | 2/1996 | Lin | 361/710 |
| 5,771,155 A | * | 6/1998 | Cook | 361/710 |
| 5,808,236 A | * | 9/1998 | Brezina et al. | 174/16.3 |
| 6,449,157 B1 | * | 9/2002 | Chu | |
| 6,532,153 B1 | * | 3/2003 | Chiu | 361/703 |

OTHER PUBLICATIONS

USPGPUB US2002/0118513A1, filed Feb. 27, 2001, Koseki.*

* cited by examiner

*Primary Examiner*—Gerald Tolin
(74) *Attorney, Agent, or Firm*—Wei Te Chung

(57) ABSTRACT

A retainer device for attaching a heat sink (80) to a CPU (95) includes a retention module (10), a clamp (40), and a crank (70). The retention module has a rectangular base frame (12), and four posts (14, 16, 18, 20) extending upwardly from the base frame. The clamp has two spaced hinge portions (48) pivotably received in two rearmost posts of the retention module. A hook (52) depends from a front of the clamp. The crank has an offset pressing portion (72), two pivot arms (74) extending from opposite ends of the pressing portion, and an operation rod (76) extending perpendicularly from one end of one pivot arm. The pivot arms are pivotably received in two frontmost posts of the retention module. When the operation rod is rotated down toward the heat sink and locked at one rearmost post, the pressing portion resiliently presses the hook of the clamp.

15 Claims, 5 Drawing Sheets

RETAINER DEVICE FOR HEAT SINK ASSEMBLY

BACKGROUND OF THE INVENTION

1. Field of the Invention

The present invention relates to a retainer device for a heat sink assembly, and particularly to a retainer device incorporating a crank to readily and securely retain a heat sink on a central processing unit (CPU).

2. Related Art

Heat sinks are often used to dissipate heat from CPUs of computers. The heat sinks can be attached to the CPUs in a variety of ways, such as by gluing or using clips. An example of a conventional heat sink assembly is disclosed in Taiwan Patent Application No. 89210547. A clip of such heat sink assembly comprises a pressing portion, two spring portions extending from opposite ends of the pressing portion, and two locking arms depending from distal ends of the spring portions for engaging with a connecting element such as a socket. However, the clip and the connecting element are separate parts. Storage and transportation of these separate parts increases cost.

In addiction, developments in integrated circuits have resulted in greater circuit density and complexity, thus increasing heat generated by operation of such integrated circuits within an electronic package. Therefore, bigger and heavier heat sinks are becoming increasingly necessary to efficiently remove the heat. Nowadays, strong resilient clips are often used to attach heat sinks onto electronic devices. Accordingly, the force required to keep a heat sink in place has also increased. Unfortunately, in assembly, operators must exert great manual force when attaching the clip to the socket or to the motherboard. Extra tools are often required for installation or removal of the clip. There is considerable risk that during use of such tools, nearby components such as a motherboard will be accidentally damaged.

Thus a retainer device that can conveniently and safely secure a heat sink is desired.

BRIEF SUMMARY OF THE INVENTION

Accordingly, an object of the present invention is to provide a retainer device which can readily and securely attach a heat sink to a CPU.

Another object of the present invention is to provide a retainer device which does not require a tool when the retainer device is manipulated to attach/detach a heat sink to/from a CPU.

To achieve the above-mentioned objects, a retainer device for attaching a heat sink to a CPU comprises a retention module, a clamp, and a crank. The retention module has a rectangular base frame, and four posts extending upwardly from the base frame. The clamp has two spaced hinge portions pivotably received in two rearmost posts of the retention module. A hook depends from a front of the clamp. The crank has an offset pressing portion, two pivot arms extending from opposite ends of the pressing portion, and an operation rod extending perpendicularly from one end of one of the pivot arms. The pivot arms are pivotably received in two frontmost posts of the retention module, with the pressing portion being disposed between the frontmost posts. When the operation rod is rotated down toward the heat sink and locked at one of the rearmost posts, the pressing portion resiliently presses the hook of the clamp.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
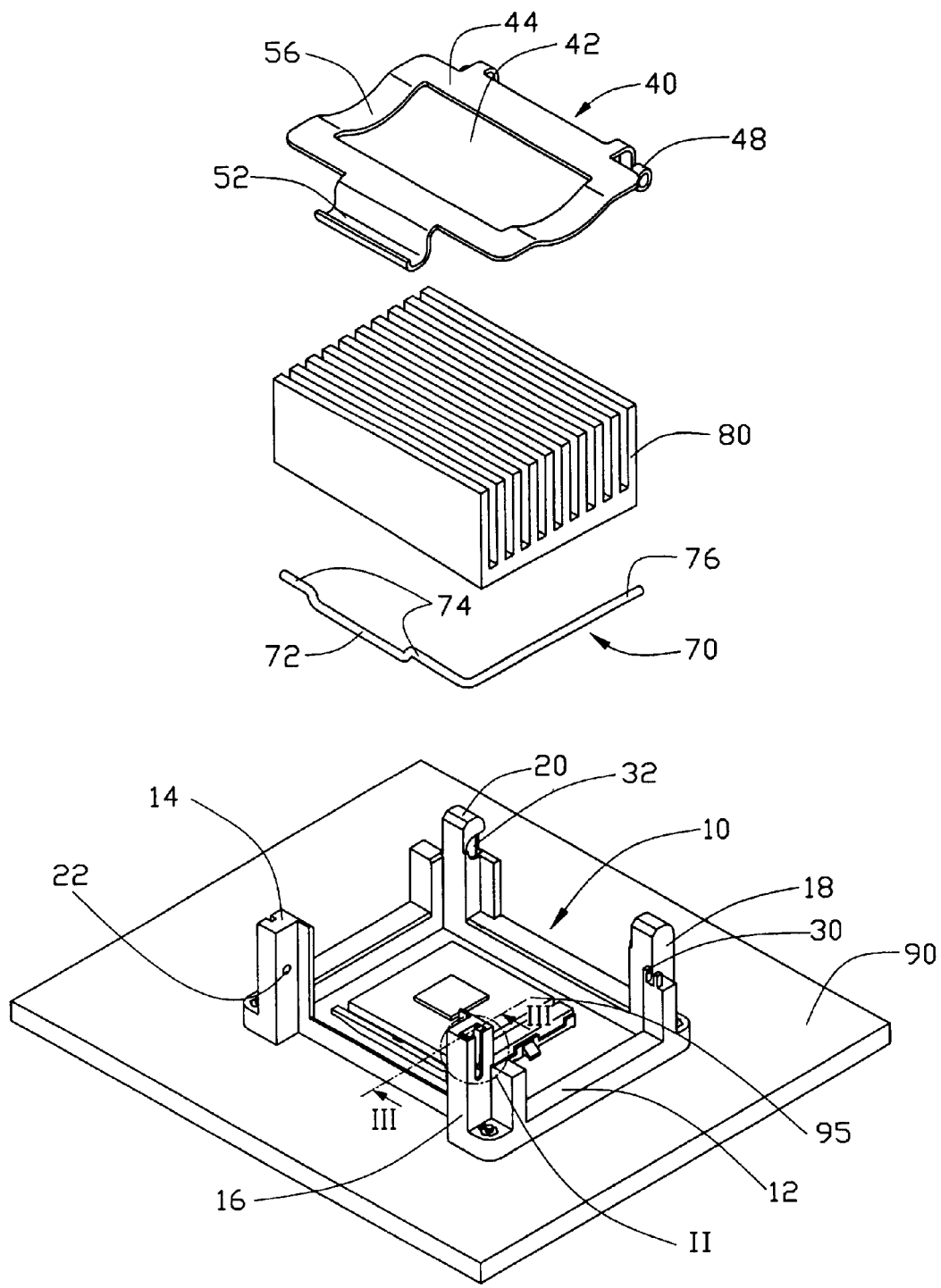
FIG. 1 is an exploded perspective view of a retainer device in accordance with the present invention, together with a heat sink, a CPU, a CPU socket and a motherboard.
Figure 2:
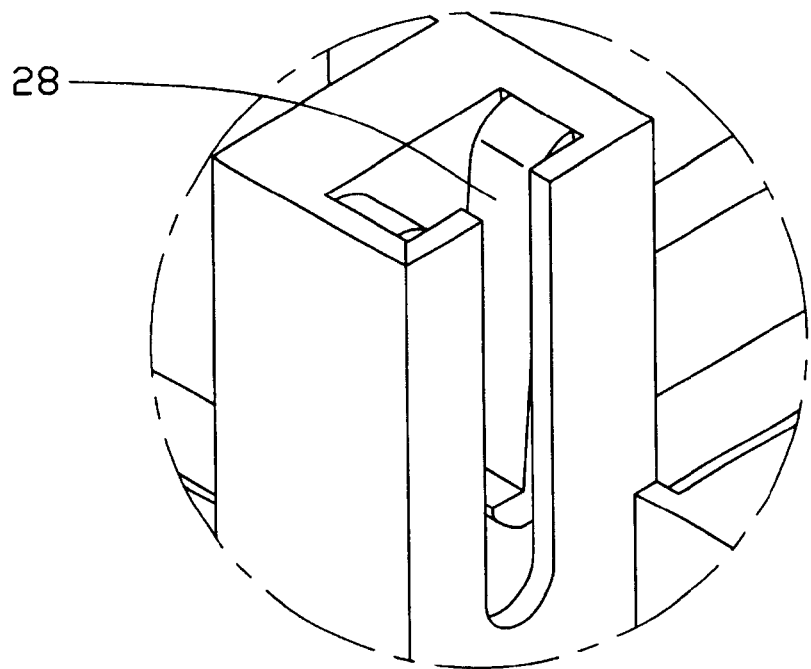
FIG. 2 is an enlarged view of an encircled portion II of FIG. 1.
Figure 3:
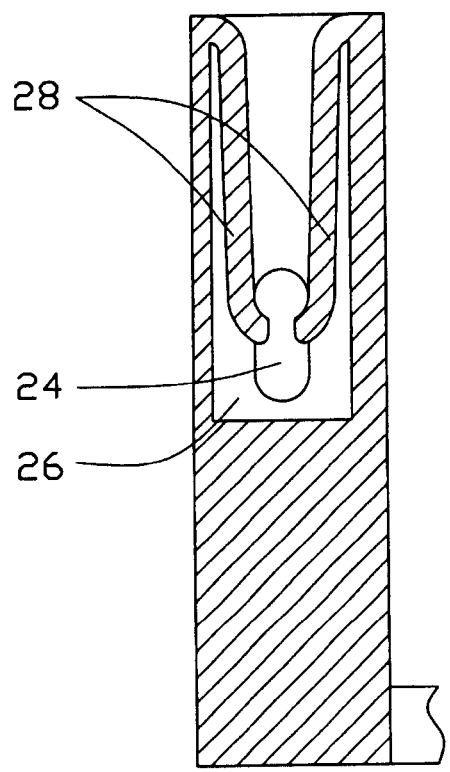
FIG. 3 is an enlarged cross-sectional view taken along line III—III of FIG. 1.

Referring to FIGS. 1–3, a retainer device in accordance with the present invention includes a retention module 10, a clamp 40 and a crank 70. The retainer device is used to attach a heat sink 80 to a CPU 95 mounted on a motherboard 90.

The retention module 10 includes a rectangular base frame 12 for surrounding the CPU 95; and a first post 14, a second post 16, a third post 18 and a fourth post 20 extending upwardly from four corners of the base frame 12 respectively. The base frame 12 is mounted to the motherboard 90 with four bolts (not labeled) extending through the four corners of the base frame 12. A pivot hole 22 is defined in an inner side of the first post 14 that faces the second post 16. A through hole 24 and a containing slot 26 are defined in the second post 16 (see FIGS. 2 and 3). The through hole 24 is generally in alignment with the pivot hole 22 of the first post 12. A pair of symmetrically opposite resilient restricting tabs 28 is formed in the containing slot 26. The restricting tabs 28 depend from an upper portion of the second post 16. A locking portion 30 is formed next to the third post 18. The locking portion 30 may comprise, for example, two resiliently deformable arms adapted to retain the crank 70. Two opposing arch-shaped recesses 32 (only one labeled) are respectively defined in upper portions of inner side walls of the third and fourth posts 18, 20.

The clamp 40 is for pressing the heat sink 80, and includes a frame 44, a pair of spaced hinge portions 48 formed at a rear of the frame 44, and a hook 52 depending from a front of the frame 44 and then extending outwardly and upwardly. An opening 42 is defined in the middle of the frame 44, for facilitating ventilation of the heat sink 80. The frame 44 has a curved portion 56 at each of opposite lateral sides thereof, for providing resiliency. The hinge portions 48 correspond to the recesses 32 of the retention module 10.

The crank 70 includes an offset pressing portion 72, two pivot arms 74 extending from opposite ends of the pressing portion 72 respectively, and an operation rod 76 extending perpendicularly from one end of one of the pivot arms 74. The operation rod 76 facilitates operation of the crank 70.

Figure 4:
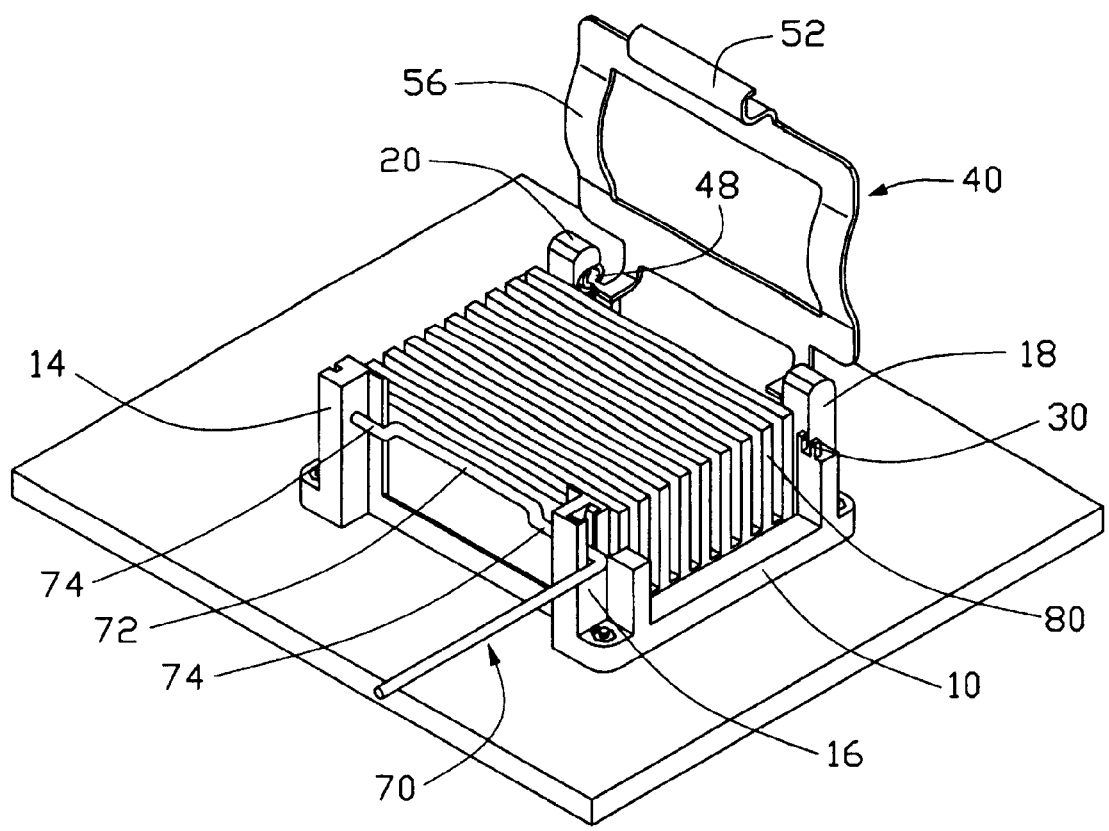
FIGS. 4 and 5 are partly assembled views of FIG. 1, showing successive stages in the assembly process.
Figure 5:
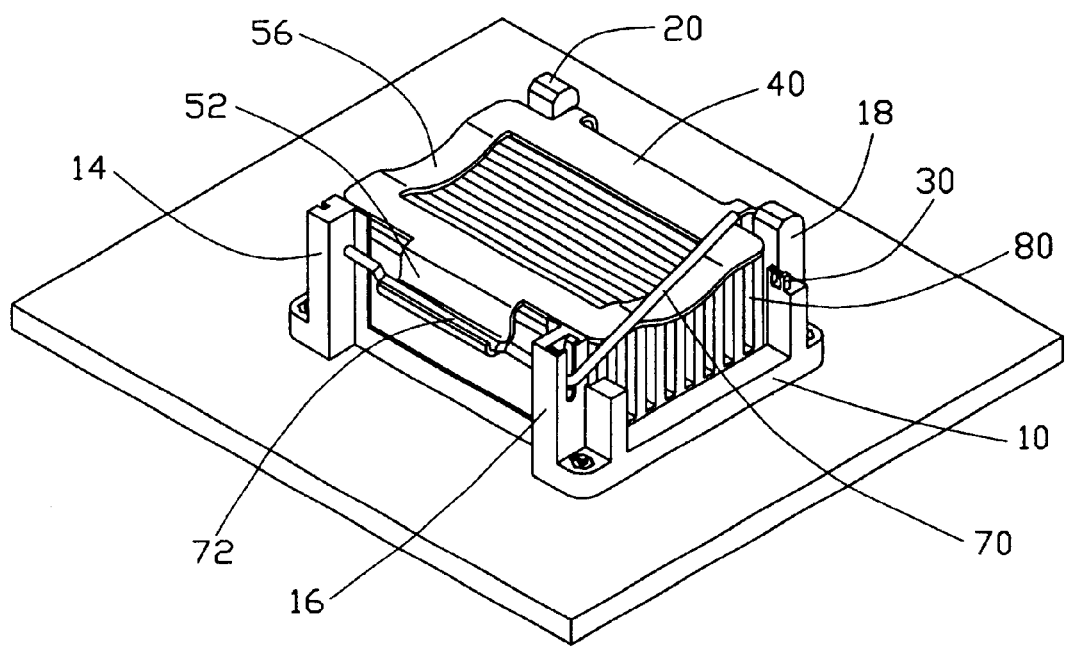
Figure 6:
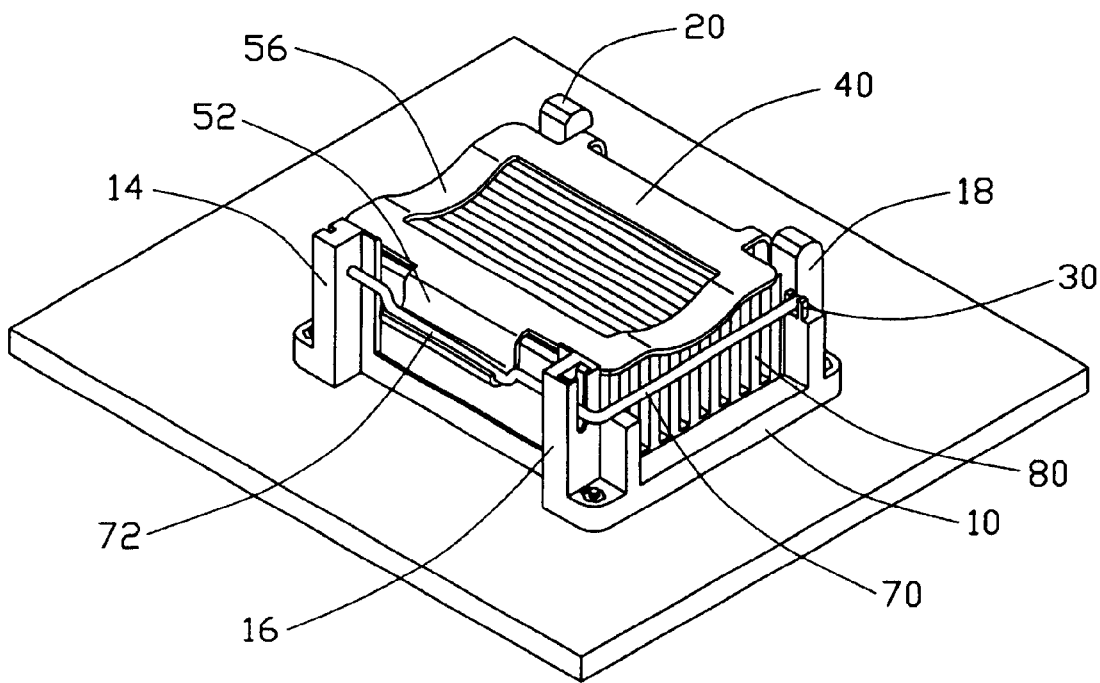
FIG. 6 is a fully assembled view of FIG. 1.

Referring also to FIGS. 4–6, in assembly of the retainer device, the hinge portions 48 of the clamp 40 are rotatably received in the recesses 32 of the third and fourth posts 18, 20 of the retention module 10. The clamp 40 is oriented vertically, and can pivot about the third and fourth posts 18, 20 of the retention module 10. A distal one of the pivot arms 74 and the pressing portion 72 of the crank 70 are extended through the through hole 24 of the second post 16, and the distal pivot arm 74 is pivotably received in the pivot hole 22 of the first post 14. A proximal one of the pivot arms 74 is pivotably retained between the two resilient tabs 28 of the second post 16. The pressing portion 72 is disposed between the first and second posts 14, 16. The operation rod 76 is oriented such that it extends horizontally outwardly away from the second post 16. In this position, the pressing portion 72 of the crank 70 is at a highest location (see FIG. 4). The clamp 40 is then rotated down toward the heat sink 80. The hook 52 thereby enters a space (not labeled) under the pressing portion 72 of the crank 70. Then the operation rod 76 is rotated upwardly and toward the heat sink 80 (see FIG. 5) until it reaches a substantially horizontal position alongside the heat sink 80, whereupon it is locked in the locking portion 30 of the third post 18 (see FIG. 6). The pressing portion 72 of the crank 70 is at a lowest location, and resiliently presses the hook 52 downwardly. The clamp 40 thereby securely attaches the heat sink 80 to the CPU 95.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A retainer device for fastening a heat sink to a heat-generating electronic device mounted on a circuit board, the retainer device comprising:
   a retention module placed around the electronic device, the retention module having a base frame and a plurality of posts extending upwardly from the base frame;
   a clamp rotatably attached to one side of the retention module, the clamp having a fastening portion at a front thereof; and
   a crank rotatably attached to the retention module, the crank pressing the fastening portion of the clamp whereby the clamp attaches the heat sink to the electronic device, the crank comprising an operation rod for facilitating operation.

2. The retention device as described in claim 1, wherein the crank further comprises an offset pressing portion and two pivot arms at opposite sides of the pressing portion, the operation rod extending from one end of one of the pivot arms.

3. The retention device as described in claim 2, wherein a pivot hole is defined in one of two frontmost posts of the retention module, and a through hole is defined in the other of the frontmost posts generally in alignment with the pivot hole.

4. The retention device as described in claim 3, wherein the pivot arms of the crank are respectively movable received in the pivot hole and the through hole, and the pressing portion of the crank is disposed between the frontmost posts.

5. The retention device as described in claim 1, wherein two recesses are defined in two opposing inner side walls of two rearmost posts of the retention module, and the recesses movably receive two hinge portions of the clamp therein.

6. The retention device as described in claim 1, wherein the fastening portion of the clamp comprises a hook which depends from the front of the clamp.

7. The retention device as described in claim 1, wherein the clamp has curved portions for providing resiliency.

8. The retention device as described in claim 1, wherein a locking portion is formed on the retention module for locking the operation rod of the crank when the crank is pressing the fastening portion of the clamp.

9. A heat dissipating assembly, comprising:
   a circuit board;
   an electronic device mounted on the circuit board;
   a heat sink attached to the electronic device;
   a retention module attached to the circuit board and accommodating the electronic device, the retention module having a base frame and a plurality of posts extending upwardly from the base frame;
   a clamp hingedly attached to a rear of the retention module, a hook depending from a front of the clamp; and
   a crank pivotably attached to a front of the retention module, the crank pivotably and transversely retained in two frontmost posts of the retention module, the crank having a offset pressing portion, two pivot arms at opposite ends of the pressing portion, and an operation rod extending from one end of one of the pivot arms, wherein
   when the operation rod extends away from the heat sink, the offset pressing portion of the crank is at a highest position; and when the operation rod is pivoted to a position alongside the heat sink, the offset pressing portion of the crank is at a lowest position and presses the hook of the clamp.

10. The heat dissipating assembly as described in claim 9, wherein the clamp has curved portions for providing resiliency.

11. The heat sink assembly as described in claim 9, wherein a locking portion is formed on the retention module for locking the operation rod when the offset pressing portion of the crank is pressing the hook of the clamp.

12. A retainer device assembly comprising:
    a substrate;
    a retention module positioned upon said substrate and defining therein a cavity with a device located therein;
    a clamp pivotally mounted on one side of the retention module with a fastening portion at thereof a distal end far away from a pivotal axis of said clamp; and
    a crank being constantly assembled to the other side of the retention module opposite to said side the retention module while being moveable in upper and lower positions; wherein
    in assembling first said crank is located in the upper position, and thus said fastening portion is allowed to pass by said crank without interference so that the clamp is able to be initially loosely sits upon the devices; successively said crank is moved to be located in the lower position to press against the fastening portion thereunder so that the clamp finally tightly abuts against the device for reliable retention of the device relative to the retention module.

13. The assembly as described in claim 12, wherein said crank is pivotally moved relative to the retention module.

14. The assembly as described in claim 13, wherein said crank includes an operation rod extending from a pivot axis of said crank.

15. The assembly as described in claim 14, wherein when said crank is in a lower position, said operation rod extends away from the pivot axis of the crank in a first direction, while said clamp essentially extends away from the pivot axis of the clamp in a second direction opposite to said first direction.

* * * * *